United States Patent
Samuelson et al.

(10) Patent No.: US 9,954,060 B2
(45) Date of Patent: *Apr. 24, 2018

(54) METHOD FOR MANUFACTURING A NANOWIRE STRUCTURE

(71) Applicant: QUNANO AB, Lund (SE)

(72) Inventors: Lars Samuelson, Malmö (SE); Knut Deppert, Lund (SE); Jonas Ohlsson, Malmö (SE); Martin Magnusson, Malmö (SE)

(73) Assignee: QUNANO AB, Lund (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/067,968

(22) Filed: Mar. 11, 2016

(65) Prior Publication Data

US 2016/0268374 A1    Sep. 15, 2016

Related U.S. Application Data

(63) Continuation of application No. 13/518,259, filed as application No. PCT/SE2010/051461 on Dec. 22, 2010, now Pat. No. 9,305,766.

(30) Foreign Application Priority Data

Dec. 22, 2009 (SE) ..................... 0951018

(51) Int. Cl.
  *H01L 21/326* (2006.01)
  *H01L 29/08* (2006.01)
  (Continued)

(52) U.S. Cl.
  CPC ............ *H01L 29/0669* (2013.01); *B03C 7/00* (2013.01); *B82Y 10/00* (2013.01); *H01L 21/02* (2013.01);
  (Continued)

(58) Field of Classification Search
  CPC ................. H01L 21/02; H01L 21/0257; H01L 21/02603; H01L 21/0262; H01L 21/02623;
  (Continued)

(56) References Cited

U.S. PATENT DOCUMENTS 6,536,106 B1    3/2003  Jackson et al.
7,067,867 B2    6/2006  Duan et al.
(Continued)

FOREIGN PATENT DOCUMENTS

CN    1745468 A    3/2006
CN    101254914 A    9/2008
(Continued)

OTHER PUBLICATIONS

Notice of Reasons for Rejection for Japanese Patent Application No. 2015-104047, dated Jul. 26, 2016, 5 pages.
(Continued)

*Primary Examiner* — Dzung Tran
(74) *Attorney, Agent, or Firm* — The Marbury Law Group PLLC (57) ABSTRACT

The present invention provides a method for aligning nanowires which can be used to fabricate devices comprising nanowires that has well-defined and controlled orientation independently on what substrate they are arranged on. The method comprises the steps of providing nanowires and applying an electrical field over the population of nanowires, whereby an electrical dipole moment of the nanowires makes them align along the electrical field. Preferably the nanowires are dispersed in a fluid during the steps of providing and aligning. When aligned, the nanowires can be fixated, preferably be deposition on a substrate. The electrical field can be utilized in the deposition. Pn-junctions or any net charge introduced in the nanowires may assist in the (Continued)

aligning and deposition process. The method is suitable for continuous processing, e.g. in a roll-to-roll process, on practically any substrate materials and not limited to substrates suitable for particle assisted growth.

26 Claims, 8 Drawing Sheets (51) Int. Cl.
    H01L 29/04      (2006.01)
    H01L 29/06      (2006.01)
    B82Y 10/00      (2011.01)
    B03C 7/00       (2006.01)
    H01L 21/02      (2006.01)
    H01L 29/66      (2006.01)
    H01L 31/0352    (2006.01)
    H01L 31/068     (2012.01)
    H01L 31/072     (2012.01)
    H01L 31/18      (2006.01)
    B82Y 40/00      (2011.01)

(52) U.S. Cl.
    CPC ...... H01L 21/0257 (2013.01); H01L 21/0262 (2013.01); H01L 21/02603 (2013.01); H01L 21/02623 (2013.01); H01L 21/02628 (2013.01); H01L 29/068 (2013.01); H01L 29/0665 (2013.01); H01L 29/0673 (2013.01); H01L 29/0676 (2013.01); H01L 29/66136 (2013.01); H01L 29/66143 (2013.01); H01L 31/035227 (2013.01); H01L 31/068 (2013.01); H01L 31/072 (2013.01); H01L 31/18 (2013.01); B82Y 40/00 (2013.01)

(58) Field of Classification Search
    CPC ............. H01L 29/0665; H01L 29/0673; H01L 29/66136; H01L 29/66143; H01L 31/035227; H01L 31/072; H01L 31/079; B03C 7/00; B82Y 10/00; B82Y 40/00
    USPC ............................. 257/40, 59, 79; 438/466
    See application file for complete search history.

(56) References Cited

U.S. PATENT DOCUMENTS

| 7,335,908 | B2 | 2/2008 | Samuelson et al. | |
| 2002/0175408 | A1* | 11/2002 | Majumdar | B82Y 10/00 257/734 |
| 2003/0186522 | A1* | 10/2003 | Duan | B81C 99/008 438/584 |
| 2004/0036128 | A1* | 2/2004 | Zhang | B82Y 10/00 257/401 |
| 2004/0213307 | A1* | 10/2004 | Lieber | B82Y 10/00 372/39 |
| 2005/0064618 | A1* | 3/2005 | Brown | B82Y 10/00 438/49 |
| 2005/0079659 | A1 | 4/2005 | Duan et al. | |
| 2005/0161662 | A1 | 7/2005 | Majumdar et al. | |
| 2005/0181587 | A1 | 8/2005 | Duan et al. | |
| 2006/0008942 | A1 | 1/2006 | Romano et al. | |
| 2006/0125025 | A1 | 6/2006 | Kawashima et al. | |
| 2006/0207647 | A1* | 9/2006 | Tsakalakos | B82Y 20/00 136/256 |
| 2006/0216602 | A1 | 9/2006 | Larouche et al. | |
| 2007/0048492 | A1 | 3/2007 | Lieber et al. | |
| 2008/0150025 | A1 | 6/2008 | Jain | |
| 2008/0224123 | A1 | 9/2008 | Martin et al. | |
| 2008/0280069 | A1 | 11/2008 | Parce et al. | |
| 2008/0286521 | A1* | 11/2008 | Eberlein | B82Y 10/00 428/114 |
| 2010/0283064 | A1 | 11/2010 | Samuelson et al. | |
| 2011/0284380 | A1 | 11/2011 | Martin et al. | |
| 2012/0021854 | A1 | 1/2012 | Gazit et al. | |

FOREIGN PATENT DOCUMENTS

| CN | 101540287 A | 9/2009 |
| JP | 2000294119 A | 10/2000 |
| JP | 2006261666 A | 9/2006 |
| JP | 2007506643 A | 3/2007 |
| JP | 2007-290908 | 8/2007 |
| JP | 2008514544 A | 5/2008 |
| JP | 2009130352 A | 6/2009 |
| WO | WO0101475 A1 | 1/2001 |
| WO | WO2006038504 A1 | 4/2006 |
| WO | WO 2007-102781 A1 | 9/2007 |
| WO | WO 2008-060455 A2 | 5/2008 |
| WO | WO2008118095 A | 10/2008 |
| WO | WO 2009-000285 A1 | 12/2008 |

OTHER PUBLICATIONS

Dai et al., "The Alignment of Carbon Nanotubes", Journal of Synthetic Crystals, vol. 36, No. 6 (2007).
English translation of the text of Chinese Office Action received in connection with Chinese Application No. 2010800645656, dated Mar. 7, 2014.
Chinese Search Report received in connection with Chinese Application No. 2010800645656, dated Feb. 27, 2014.
Third Office Action from State Intellectual Property Office of P.R. China, received in connection with Chinese Application No. 201080064565.6, dated Sep. 2, 2014.
English translation of the text of Third Chinese Office Action received in connection with Chinese Application No. 201080064565.6, dated Sep. 2, 2014.
Lee, Ming-Wei et al., "An Optically-Driven Platform for Manipulation of Carbon Nanotubes", 9th IEEE Conference on Nanotechnology 2009, pp. 515-517.
Jamshida, Arash et al., "Semiconductor Nanowire Manipulation Using Optoelectronic Tweezers", Univ. of California, Technical Report No. UCB/EECS-2006-116, Sep. 21, 2006.
International Search Report, ISA/SE, PCT/SE2010/051461, Mar. 22, 2011, 4pgs.
Japanese Office Action, Notice of Reasons for Rejection for Japanese Patent Application No. 2012-545905 (based on PCT/SE2010/051461) dated Jan. 6, 2015 (5 pages).
Second Japanese Office Action, Notice of Reasons for Rejection, for Japanese Patent Application No. 2015-104047, dispatch dated Jan. 10, 2017, 4 pages, including English Language Translation.
The extended European Search Report for European Application No. 10839901.5, (dated May 30, 2017), 6 pages.
Japanese Office Communication, Decision to Dismiss the Amendment for Japanese Patent Application No. 2015-104047, dated Jun. 13, 2017, 5 pages.
Japanese Office Communication, Decision of Rejection for Japanese Patent Application No. 2015-104047, dated Jun. 13, 2017, 2 pages.
Korean Office Communication, First Korean Office Action for Korean Patent Application No. 10-2012-7019100, dated Jun. 20, 2017, 6 pages.
Second Chinese Office Communication for Chinese Patent Application No. 201510253715.2, dated Aug. 10, 2017, 3 pages.
State Intellectual Property Office of People's Republic China First Office Action for Chinese Patent Application No. 201510253715.2, dated Sep. 26, 2016, 23 pages, including English Language Translation.

* cited by examiner

METHOD FOR MANUFACTURING A NANOWIRE STRUCTURE

TECHNICAL FIELD OF THE INVENTION

The present invention relates to manufacturing of nanowire devices, in particular nanowire devices comprising nanowires aligned and protruding in a pre-determined direction from a substrate.

BACKGROUND OF THE INVENTION

Over recent years the interest in semiconductor nanowires has increased. In comparison with conventional planar technology nanowire based semiconductor devices offer unique properties due to the one-dimensional nature of the nanowires, improved flexibility in materials combinations due to less lattice matching restrictions and opportunities for novel device architectures. Suitable methods for growing semiconductor nanowires are known in the art and one basic process is nanowire formation on semiconductor substrates by particle-assisted growth or the so-called VLS (vapor-liquid-solid) mechanism, which is disclosed in e.g. U.S. Pat. No. 7,335,908. Particle-assisted growth can be achieved by for instance use of chemical beam epitaxy (CBE), metalorganic chemical vapor deposition (MOCVD), metalorganic vapor phase epitaxy (MOVPE), molecular beam epitaxy (MBE), laser ablation and thermal evaporation methods. However, nanowire growth is not limited to VLS processes, for example the WO 2007/102781 shows that semiconductor nanowires may be grown on semiconductor substrates without the use of a particle as a catalyst. Nanowires have been utilised to realise devices such as solar cells, field effect transistors, light emitting diodes, thermoelectric elements, etc which in many cases outperform conventional devices based on planar technology.

Although having advantageous properties and performance the processing of nanowire devices was initially costly. One important breakthrough in this respect was that methods for growing group III-V semiconductor nanowires, and others, on Si-substrates has been demonstrated, which is important since it provides a compatibility with existing Si processing and non-affordable III-V substrates can be replaced by cheaper Si substrates.

When producing semiconductor nanowire devices comprising nanowires grown on a semiconductor substrate utilizing the above mentioned techniques a number of limitations are experienced:
- an MOCVD system is a complex vacuum system, which significantly contributes to the production cost for the device;
- growth is performed in batches, with inherent variations between individual batches;
- growth of a large number of nanowires over a large surface yields variations between nanowires in the same batch;
- the nanowires are grown on substrates which needs to withstand temperatures of 400-700° C.; and
- to align nanowires in the vertical direction, or any other direction, on the semiconductor substrate requires controlled epitaxial growth.

SUMMARY OF THE INVENTION

In view of the foregoing one object of the invention is to provide alternative methods for producing nanowire semiconductor devices that overcome the above-mentioned drawbacks of prior art. More particularly, it is an object to provide nanowires that have well-defined and controlled orientation independently of what substrate they are arranged on.

Hence a method for aligning nanowires is provided. The method comprises the steps of providing nanowires and applying an electric field over the population of nanowires, whereby an electric polarization in the nanowires makes them align along the electrical field. Preferably the nanowires are dispersed in a fluid (gas or liquid) during the steps of providing and aligning.

In addition to the polarization to make wires align in the electric field, an electric dipole in the wires may be induced to provide further directionality to and to enhance the alignment. Such a dipole may be induced by a pn-junction in the axial direction of the wire; by a Schottky diode between semiconductor and metallic sections of the wire; or by piezoelectric effects; and the effect may be enhanced by illuminating the wire during alignment, effectively inducing an open circuit photo voltage between the ends of the wire. The magnitude of this light induced dipole is essentially independent of the illumination strength, since the open circuit voltage of a photodiode varies only logarithmically with illumination.

When aligned, the nanowires can be fixated, preferably in contact with a substrate. The electrical field can be utilised to bring the nanowires in contact with the substrate, or an opposed surface. Charged nanowires are attracted to an oppositely charged surface in a uniform electric field. Uncharged nanowires are attracted to regions with higher electric fields, in the case of a field gradient.

Charged wires in a field gradient will experience both effects, either in the opposite or in the same direction. The force due to charge on the wire depends only on the charge and the electric field strength. The force due to the gradient depends on the field strength the wire dimensions and on the electric polarizability. Thus, by arranging the two forces in opposite directions, nanowires can be classified according to length, size and composition. The gradient force on its own may also be used for classification, in which case only a difference in that force is used to guide wires in different directions.

Having nanowires with pn-junctions and/or illumination of the nanowires with light of a pre-determined wavelength (s) may assist in aligning the nanowires and/or enables selective alignment of one or more sub-populations of nanowires.

The method may be performed in a continuous process, such as a roll-to-roll process wherein said population of nanowires are repeatedly provided and deposited in a pre-determined configuration along the substrate.

Thanks to the invention it is possible to produce nanowire devices comprising aligned nanowires in a cost-efficient way and without being limited by the limitations of epitaxial methods.

One advantage of the present invention is that nanowires can be produced separately from the deposition of the nanowires onto a substrate. Hence a continuous process can be used. This simplifies the manufacturing of nanowire devices and improves the yield.

Nanowires deposited with the method described here may be aligned vertically, with only a small angle away from the normal, or with a large spread of angles. In the latter case, the key is that the wires have a clear preferential direction, so that the majority of the wires have the same end toward the substrate. In the former case, the vertical alignment may be more important, and the up/down orientation less so.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein FIG. 1 schematically illustrates alignment of a nanowire in accordance with the invention.

DETAILED DESCRIPTION OF EMBODIMENTS

The method of the present invention comprises the steps of providing nanowires and applying an electrical field over the nanowires, whereby an electrical dipole and/or dipole moment in the nanowires makes them align along the electrical field.

In order to manufacture a structure comprising aligned nanowires, the aligned nanowires have to be fixated in aligned position. Furthermore, the nanowires are preferably connected electrically and/or optically in one or both ends. Thus, the aligned nanowires are preferably deposited onto a substrate.

The pre-fabricated nanowires may be dispersed in a fluid before applying the electric field, and accordingly the fluid containing the nanowires can be applied to the substrate before applying the electrical field.

The electric field is in the following directed "upwards" if not otherwise explicitly stated in order to illustrate the principles of the invention, however not limited to this.

The nanowires can be pre-fabricated before being provided for alignment. Semiconductor nanowires can be fabricated using one of the afore-mentioned methods where nanowires are epitaxially grown on substrates. After growth the nanowires are removed from their substrate and preferably dispersed in a fluid (gas or liquid). The nanowires can also be fabricated using liquid solution-based chemistry or gas-phase synthesis where the nanowires grow from seed particles. In these processes the nanowires can remain in the remainder of the liquid or gas, respectively or be transferred to a suitable fluid, which also may be a liquid or a gas.

Unipolar nanowires, nanowires with axial pn-junctions, nanowires with radial pn-junctions, heterostructure nanowires, etc. may be used and are generally fabricated using one of the above-mentioned techniques. Nanowires with axial pn-junctions are grown in a in a single process, where the seed particle contains a dopant for one polarity, and where the opposite polarity is achieved when the dopant is exhausted or in a more complex process, where dopants and source materials are explicitly introduced during the process. Nanowires with radial pn-junctions are grown in a two-stage process, where growth conditions are changed to give radial growth, but otherwise similar to the fabrication of nanowires with axial pn-junctions.

Nanowires may be given a net electric charge either during growth or in a separate step.

Figure 1:
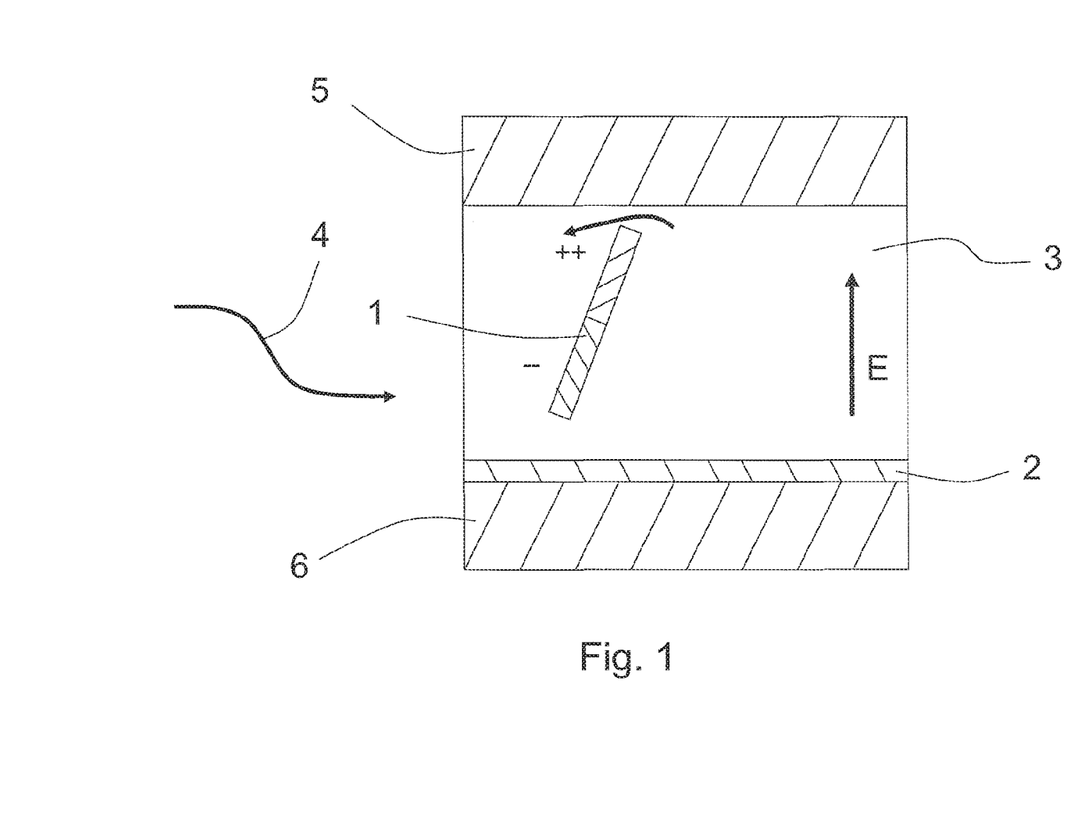

The electric dipole in the nanowires can, by way of example, be accomplished by one or a combination of the following:

1. An electric field will induce an electric polarization in any conducting, semiconducting or insulating nanowire, and the nanowires will orient themselves along the electric field (FIG. 1).
   a. For unipolar nanowires, the nanowire will be oriented along the electrical field, but with no preferred direction for a seed particle end.
   b. A unipolarly doped nanowire with an axial gradient in the doping will be preferentially oriented, since the more highly p(n)-doped end will be more easily charged positively (negatively), directing this end up (down) in the electric field.
2. A nanowire comprising a p-doped end and an n-doped end forming a pn-junction in-between will be more easily polarizable than an unipolar nanowire.
   a. The p-doped end will become positively charged and the n-doped end will be negatively charged when exposed to the electrical field, and hence the nanowire will be oriented in an unequivocal direction with the p-doped end pointing in the direction of the electric field.
   b. The same effect will apply to a unipolarly doped nanowire where a Schottky diode is formed between the wire and its seed particle.

3. Illumination of a nanowire containing a pn-junction will induce a strong electric dipole with the same polarity as the electric dipole formed by the electric field, greatly enhancing the effect of the pn-junction itself (FIG. 1).
4. By illumination with light in different pre-determined wavelength regions, nanowires having different band gaps can be selectively aligned since wires that do not absorb the light will have a much weaker dipole.

The pn-junction used for alignment may be a functional part when used in a device comprising the aligned nanowires. In addition the nanowires may comprise additional functional sections that are not intentionally used for alignment.

How effectively a wire is aligned depends on its dimensions, composition, the external electric field, and whether or not a dipole is induced, e.g., through illumination. The following general rules apply for electric field alignment. The numbers given are based on a simplified theoretical model and should not be seen as limiting for the validity of the general statements. FIGS. 3a-7b illustrate these rules.

Figure 7A:
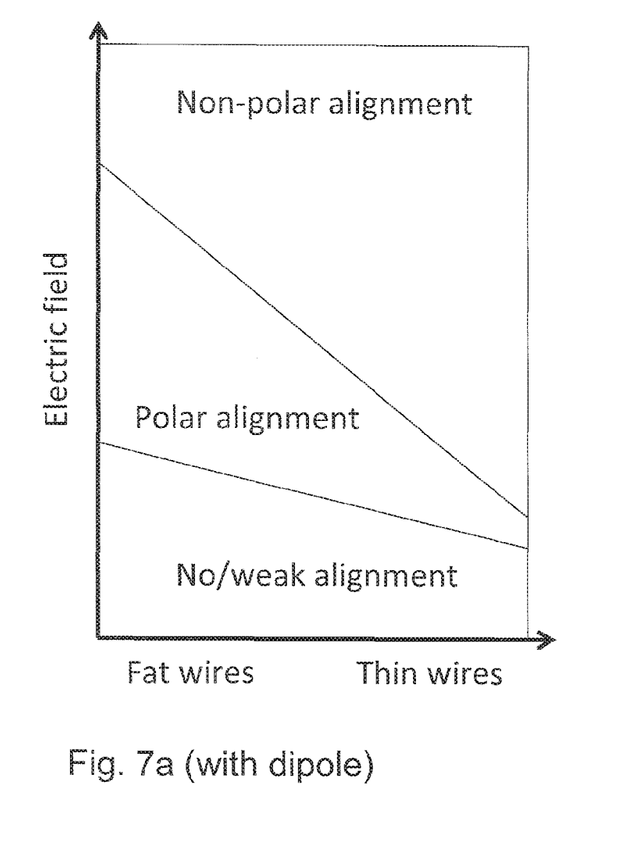
FIGS. 7a and 7b schematically illustrate the regimes where wire alignment of different kinds is at play. The axes are not necessarily linear and the borders between the regimes are not to be seen as neither as sharp nor as simply shaped as the drawing suggests.
Figure 7B:
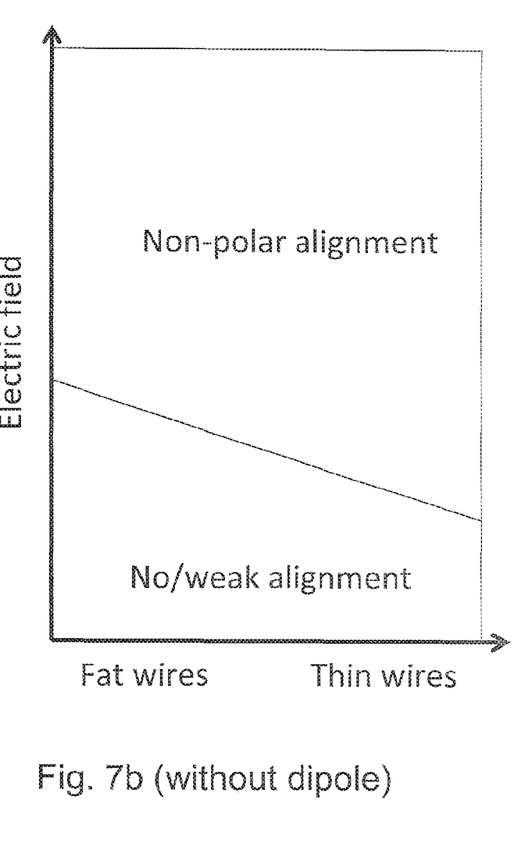
Figure 8:
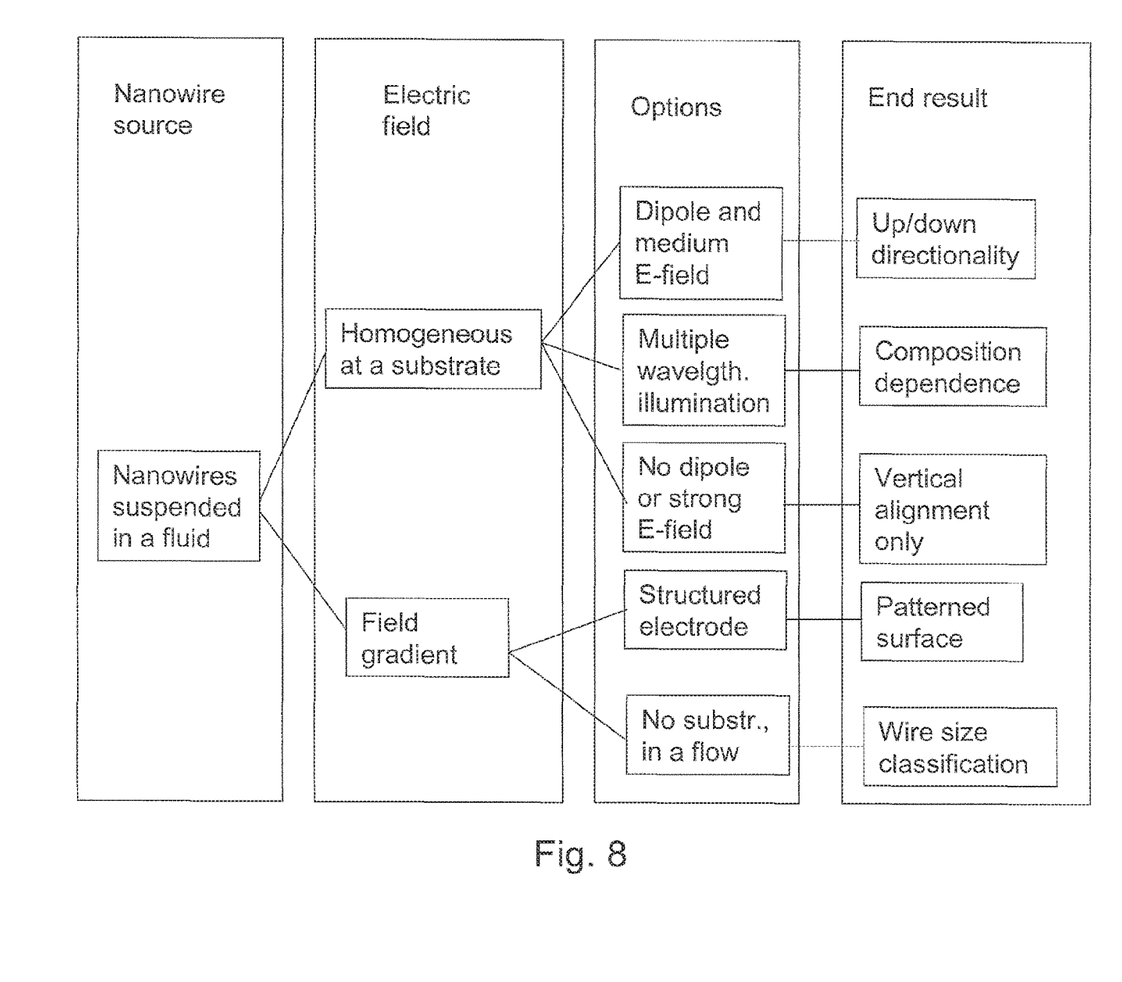
FIG. 8 illustrates some of the primary ways to apply the invention. Naturally, the components can be rearranged in many ways, and in different sequences too complex to illustrate here. For example, wire size classification may be used in combination with illumination at different wavelengths and in series with vertical alignment to selectively deposit wires according to both size and composition.

1. In the simplified model,
   a. the alignment energy due to an (induced) dipole ($E_d$) scales as the electric field to the first degree;
   b. $E_d$ scales as the square of the wire diameter but does not depend on its length;
   c. the alignment energy due to polarization of the wire material ($E_p$) scales as the square of the electric field;
   d. $E_p$ scales as the cube of the wire aspect ratio (length divided by diameter).
2. At low electric fields, typically below 100 V/cm, the alignment is weak or non-existent, meaning that the alignment energy is on the order of or below kT, which is the average energy of Brownian rotation per wire; k is the Boltzmann constant and T is the absolute temperature (300 K).
3. At high electric fields, typically above 10 kV/cm, all elongated objects are aligned without regard to direction, meaning that the alignment energy due to polarization ($E_p$) is much greater than kT.
4. Thinner and longer objects are more readily aligned than wide and short ones.
5. Under illumination or other sources of a potential difference between the wire ends, i.e., a dipole, there exists a regime where $E_d$ is both greater than $E_p$ and much greater than kT, leading to orientation with a preferential direction; this effect is greater for wider wires than for thinner ones (FIGS. 7a-7b).

Figure 2:
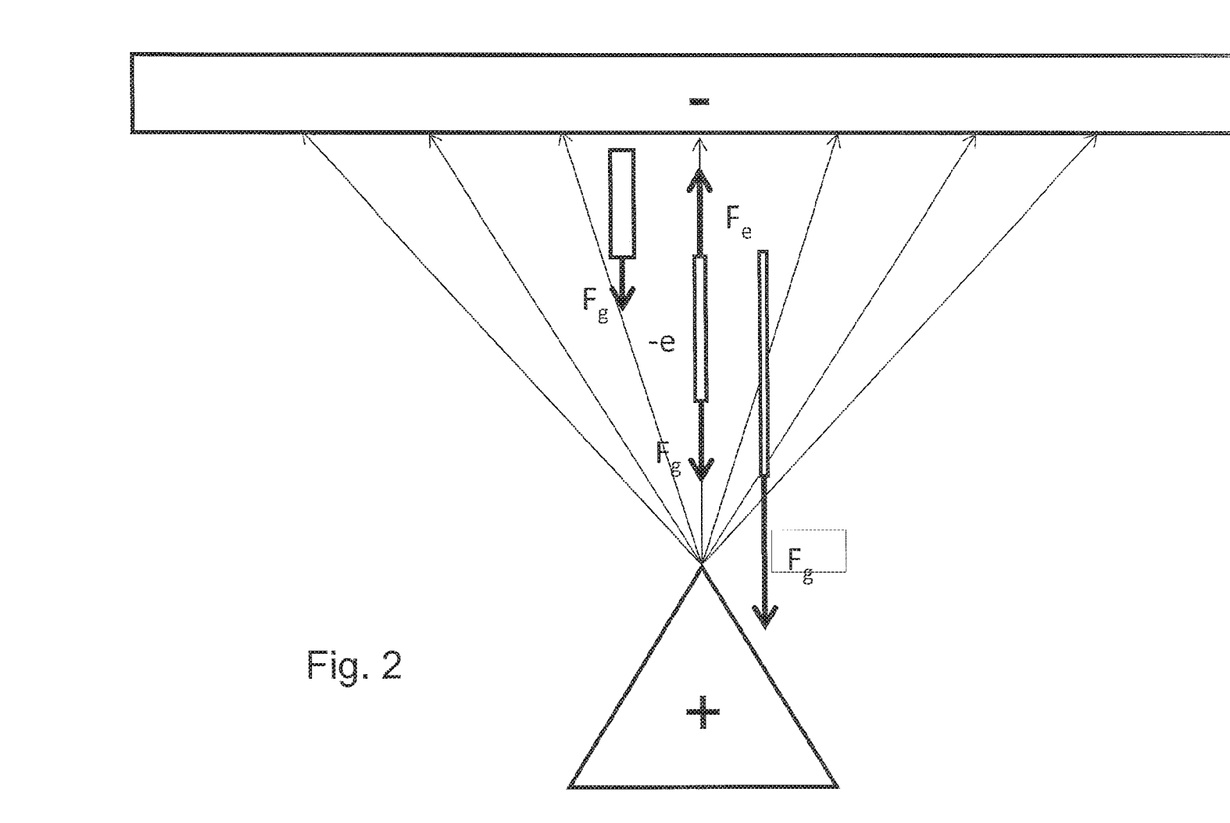
FIG. 2 schematically illustrates the concept of classifying wires in an electric field gradient. Long and thin wires are more strongly attracted towards higher electric fields than shorter thicker ones. For charged wires of the right dimension, the forces due to charge and to gradient can be made to cancel.
Figure 3A:
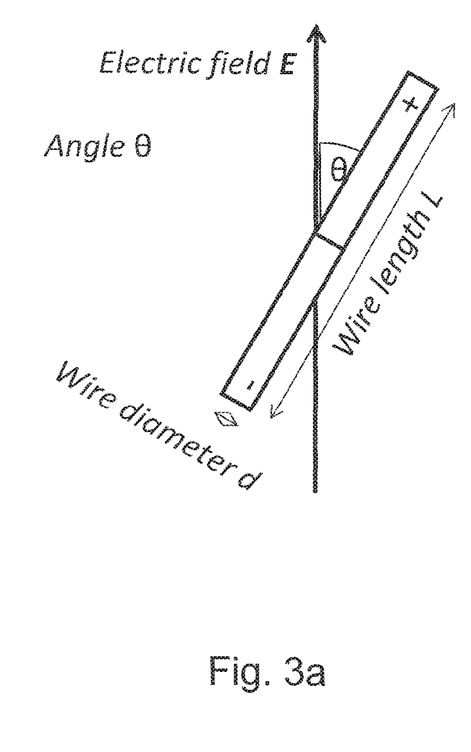
FIG. 3a schematically illustrates the dimensions and alignment angles of a nanowire in an electric field.
Figure 3B:
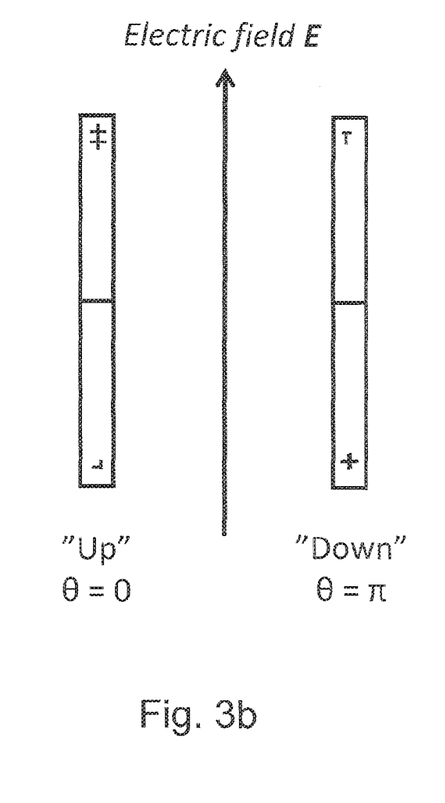
FIG. 3b illustrates the concepts of a nanowire oriented "up" and "down" with respect to the electric field.
Figure 4A:
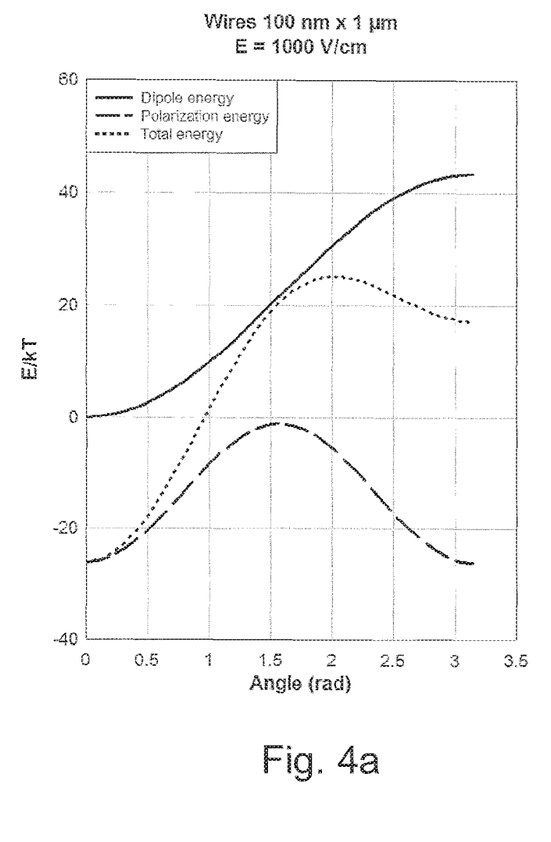
FIGS. 4a and 4b compare the theoretical alignment energy due to polarization (green, dashed), light induced dipole (red, solid), and their sum (purple, dotted) for wires of two different dimensions but at the same electric field (1000 V/cm). The alignment of the longer wire (4b) is stronger than for the shorter one (4a), but the light induced dipole is too weak to be important.
Figure 4B:
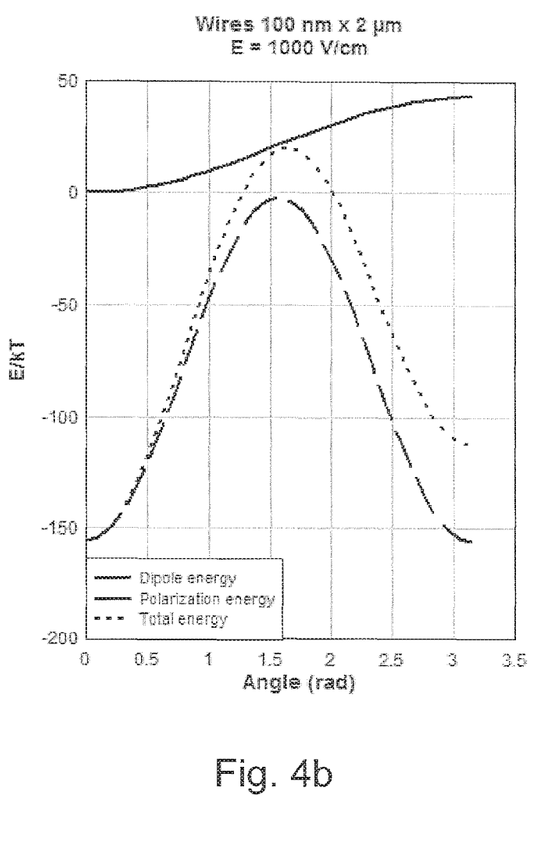
Figure 5A:
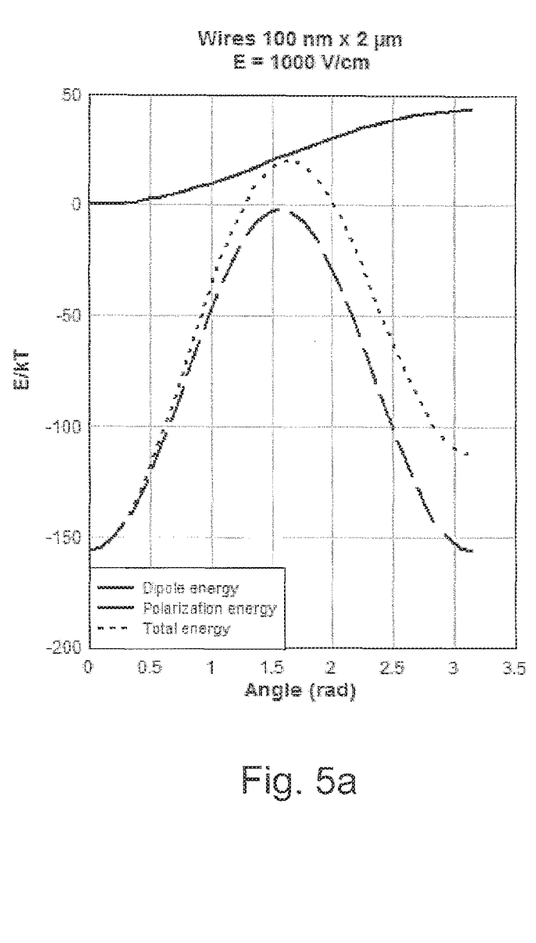
FIGS. 5a and 5b compare the theoretical alignment energy due to polarization (green, dashed), light induced dipole (red, solid), and their sum (purple, dotted) for wires of the same dimension but at different electric fields (1000 V/cm and 300 V/cm, respectively). At higher field (5a, same as 4b) the alignment is stronger than at lower field (5b), but in the latter case the light induced dipole is strong enough to dominate the alignment and provide a preferential direction.
Figure 5B:
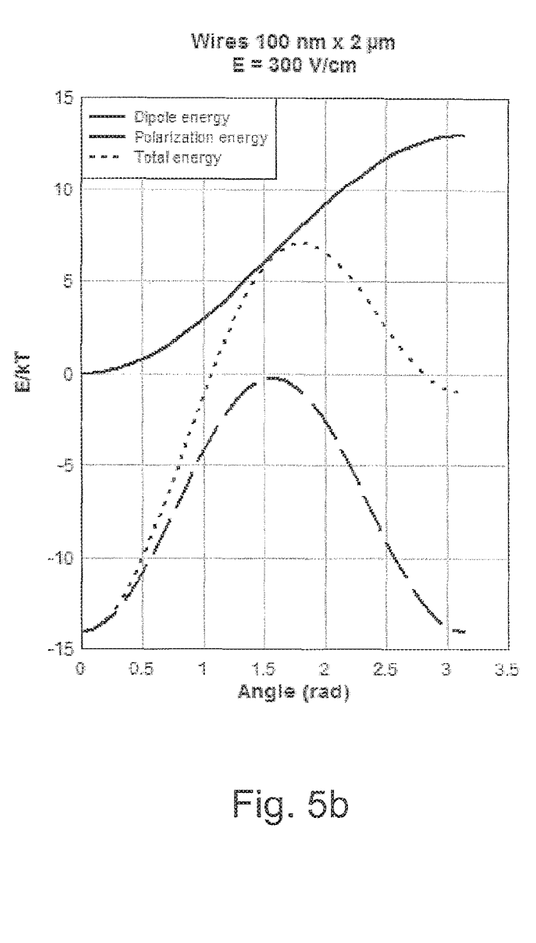
Figure 6:
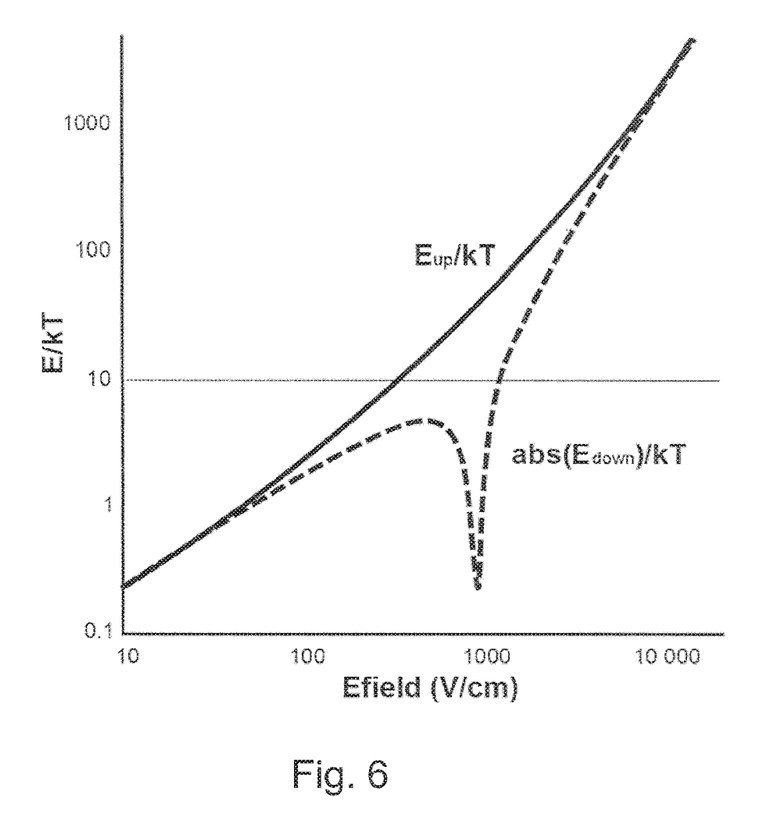
FIG. 6 illustrates the alignment energy for the "up" (red, solid) and "down" (green, dashed) directions for the same wire as in 4a at varying electric fields. There is a wide range of fields where the "up" energy is greater than 10 kT (i.e., to overcome the Brownian rotation energy of 1 kT), but where the "down" energy is low. For very thin and long wires (not shown), there exists no region where directionality is important.

Deposition of the aligned nanowires can, by way of example, be done by one or a combination of the following:
1. Nanowires with a net charge will move in the electric field; thus negatively charged nanowires will move downward, where a substrate can be placed.
2. Random diffusion of uncharged dipoles, which is particularly useful when the distance between the plate capacitors is small, where
   a. a sheath flow may be introduced to prevent deposition on one side;
   b. substrates may be placed on both sides of the nanowires for deposition of oppositely aligned wires; and
   c. the distance between electrodes can be made smaller than the wire length, forcing the wires to touch the substrate, either by moving the plates closer or by designing in a constriction in the flow of nanowire-containing fluid.
3. Dipoles with or without net charge will move in an electric field gradient, such that the wires are attracted towards higher fields. This effect can be used both for deposition and for classification of nanowires (FIG. 2).
   a. Longer and thinner wires are subjected to a stronger force due to the field gradient and will this move faster toward the regions with higher fields.
   b. The electric polarizability is different for different materials.
   c. For charged wires the gradient force can be balanced by a force due to the charged, allowing further control of size and material dependent classification.
4. On a patterned substrate electrode, the field gradient will influence deposition; in combination with wavelength-selective dipole generation, wires can be selectively placed according to composition and/or size.
5. A structured electrode behind the substrate, e.g., a bed of nails or array of ridges, will produce a pattern or dots or stripes; an alternating potential will produce areas with oppositely oriented wires.
6. Deposition may be locally enhanced or inhibited by patterns of surface charge on the substrate; the deposition may be made self-limiting when the charged areas are neutralized by the charges from the deposited wires
7. Wires may be deposited through thermophoresis, wherein wires suspended in a fluid will move towards lower temperature regions in a thermal gradient, i.e., deposited on a cold wall and/or repelled from a hot wall.
8. In the case of magnetic nanowires, they are easily collected and controlled with magnetic fields. Charged nanoparticles suspended in a flow of fluid (in effect generating an electric current) are also affected by magnetic fields.
9. Intensely focused (laser) light and magnetic fields can in some cases be used to trap nanowires locally, e.g., by the optical tweezer or magnetic trap effects.
10. Apart from the above, other things such as ultrasound, microwaves, etc., may be of use to inhibit or improve wire deposition.

The electric field may be generated using two opposed electrodes, for example two parallel plates, and applying a voltage between the electrodes. The substrate used can also function as one of the electrodes. In a continuous process the substrate, for example in the form of a web, foil or sheet may be fed between the electrodes (or over one of the electrodes if the substrate is used as one electrode) and a pulsating or periodic voltage may be applied to the electrodes to generate a varying electrical field and hence a varying orientation of the aligned nanowires.

According to the invention, nanowires can be deposited:
1. on any insulating, semiconducting or metallic substrate, which is substantially flat;
2. on substrates in form of webs, foils, or sheets, preferably in a roll-to-roll process, wherein the substrate is passed through a point, stripe or region of deposition, much like a printing press;
3. in the case of wires dispersed in a liquid, as a colloidal suspension, the wire-containing liquid can be applied to the substrate, and the wires be aligned
   a. during drying/evaporation of the liquid
   b. during or prior to solidification/polymerization of the liquid
4. on substrates coated with a polymer, metal, liquid or other material to enhance nanowire sticking and/or electrical contacting, wherein a. the sticky material may be very thin, so that only the wire ends are stuck; or
b. the sticky material has a thickness of the same order as the length of the nanowires; and
c. if the nanowires are dispersed in a liquid, the liquid may comprise monomers to make the polymer on the substrate gradually thicker, thereby encapsulating the nanowires;

5. on substrates patterned with extruding shapes, varying stickiness, surface charges, etc., to enhance or locally inhibit nanowire deposition;
6. on functional substrates, where the nanowires are intended to enhance or modify the function;
7. in complex functional patterns of dots, stripes, etc., produced by a structured electrode behind the substrate or by a structure in the (conducting) substrate itself, wherein
   a. the polarity/direction of the nanowires may vary in, e.g., stripes or checkerboard patterns; and
   b. the nanowires are of different types and sorted by inducing the electrical dipoles in a wavelength selective way;
8. on both sides of a substrate, where the wires on either side may be of different types and deposited by different means, including any of the means described above;
9. in a continuous process, where contact or adhesion layers, insulation oxides or polymers, etc., are deposited on the substrate upstream or downstream the nanowires.

By the term "nanowire" in this patent application is meant any elongated structure with at least one dimension smaller than 1 µm. Typical examples include, but are not limited to:

1. semiconductor nanowires with a diameter of 50-500 nm and a length of 1-10 µm, produced by, e.g., MOCVD growth, liquid solution chemistry, gas phase growth. Typical materials are III-V or III-N semiconductors (GaAs, InP, GaSb, GaInN and related alloys), Silicon, Germanium, or II-VI semiconductors (ZnO, ZnS, CdS, CdSe and related alloys);
2. metal nanowires produced by, e.g., electrodeposition in anodized aluminum templates, whisker growth, gas phase growth. Such nanowires may be made from magnetic, superconducting or normal metals;
3. insulating, high bandgap semiconductor, or high-TC superconductor nanowires, either manufactured or naturally occurring;
4. carbon nanotubes; or
5. biological nanofibers, e.g., cellulose, proteins, macromolecules and bacteria.

Devices to be produced with this method, however not limited to this:

1. Photovoltaic (PV) cells where the light-absorption and charge-separation takes place in the nanowires alone, i.e. where the nanowires contain pn-junctions or other rectifying mechanisms. Such PV devices include a densely packed array of nanowires, where the majority of the wires are vertically aligned and connected with the same polarity. It would also include a transparent contact either from the top or through a transparent substrate, connecting all the wire ends in parallel.
2. Light emitting diodes (LEDs) where the light-emission and charge recombination takes place in the nanowires alone, i.e. where the nanowires contain pn-junctions or other rectifying mechanisms. Such LED devices would include an array of nanowires, which may be contacted either with the same polarity or with random polarity. In the latter case, the structure would function as a rectifier, suited for connection directly to AC voltage. An LED array would also not need to be extremely dense, if the objective is to produce large area light emitting surfaces, for example ceramic tiles or even wallpaper.
3. PV cells where the nanowires constitute part of the rectifying mechanism, and the other part(s) are in the substrate; the substrate is, e.g., p-type and the wires n-type. Such a PV device would be made from densely packed nanowires, but here the up/down orientation of the wires is less important, and consequently the processing simpler. In addition, the density of the wires may be lower than in example 1 above, if the carrier diffusion length in the substrate is large enough.
4. LEDs where the nanowires constitute part of the rectifying mechanism, and the other part(s) are in the substrate; the substrate is, e.g., p-type and the wires n-type. Just as in examples 2 and 3 above, such an LED arrangement relaxes the need for both alignment and density.
5. PV cells where the nanowires constitute part of the rectifying mechanism, and the other part(s) are in the matrix surrounding the wires after deposition, e.g., p-type wires in an n-type conducting oxide or polymer. Such a PV device may be fabricated on very simple substrates.
6. LEDs where the nanowires constitute part of the rectifying mechanism, and the other part(s) are in the matrix surrounding the wires after deposition, e.g., p-type wires in an n-type conducting oxide or polymer. Just as in examples 2-5 above, such an LED arrangement relaxes the need for both alignment and density.
7. PV cells where the substrate itself is a photovoltaic cell, and where the nanowires are designed to absorb light above or below the bandgap of the substrate, thereby creating a tandem photovoltaic cell. The nanowire part of the tandem cell may be fabricated according to example 1, 3 or 5 above.
8. In all of the above examples of PV cells or LEDs, the nanowires may be arranged in patterns, e.g. stripes, to allow for spectrally resolved light absorption by means of a prism, to achieve multi-junction PV functionality; or light emission with adjustable color temperature where each stripe is contacted separately.
9. In all of the above examples of PV cells or LEDs, the nanowires also give a built-in nanostructuring of the top surface, which may be advantageous for both light absorption in the case of PV cells and for light emission in the case of LEDs.
10. Thermoelectric cells, wherein the one-dimensional character of nanowires is used to improve the way thermal gradients can be used to generate electrical power. Furthermore, by the controlled deposition of separate fields of n-doped and p-doped nanowires a Peltier element is formed, which can be used for cooling or heating applications, in the conversion of electrical power to thermal gradients.
11. Batteries where one or both electrodes are prepared by this method and thus are constructed out of a nanowire structure. The small diameter of the nanowires makes them insensitive to strain and thus to changes in diameter that are accompanied with the volume change during battery cycling.
12. Fuel cells, electrolysis or photolysis cells where the main material is comprised out of nanowire structures which gives them advantages over other materials in terms of insensitivity to process-induced strain, surface-to-volume ratio, as well as process fluid interaction with the structures.

13. Microelectronic or data storage devices may be formed in nanowires which are deposited from the aerosol phase.

14. Templates for growth of functional material films on simple substrates, where the aligned nanowires provide the crystal structure for growth of, e.g., compound semiconductors on Silicon or even on non-crystalline surfaces (metal, glass, etc.).

15. A device for classifying nanowires according to size and/or material, wherein a flow of charged or uncharged nanowires passes through an electric field gradient. Longer, thinner and more polarizable wires are subjected to stronger attractive forces towards higher electric field regions, and can thus be classified in a manner reminiscent of a mass spectrometer. For charged wires, forces may be balanced for greater selectivity.

16. Nanocomposite materials, where nanowires are dispersed in, e.g., a polymer matrix, leading to, e.g., enhanced mechanical strength, increased electrical conductivity, improved gas permeability properties, etc. Such nanocomposites may also be sensitive to applied external forces and thus used as sensors.

17. Field emission electron sources where simple or heterostructure-designed nanowires are deposited into arrays for field-emission applications.

18. Antireflective or light filtering surfaces or smart windows.

19. Surfaces with enhanced mechanical sticking ability, due to the gecko effect.

20. Surfaces with enhanced or reduced heat emission.

21. Chemical or biological sensors.

All references to upward, vertical, horizontal, lengthwise, etc. are introduced for the ease of understanding only, and should not be considered as limiting to specific orientation. Further the dimensions of the structures and axes in the drawings are not necessarily to scale.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. A method of fabricating a nanowire device, comprising:
growing a plurality of nanowires from seed particles using a gas phase synthesis process;
transferring the plurality of nanowires to a liquid to form a nanowire dispersion, the liquid dispersion consisting of the plurality of nanowires and the liquid;
providing the nanowire dispersion to a surface;
aligning the plurality of nanowires such that at least a majority of the plurality of nanowires are aligned vertically with respect to the surface such that the same end of at least a majority of the plurality nanowires points in the same direction, wherein the nanowires are aligned in a functional pattern and wherein the functional pattern comprises at least one of dots, stripes or checkerboard pattern; and
fixing the plurality of nanowires in a polymer on a substrate to form a film comprising a plurality of fixed, aligned nanowires on the substrate.

2. The method of claim 1, further comprising forming an electrical contact operatively connected to at least a portion of the plurality of fixed, aligned nanowires.

3. The method of claim 1, wherein the plurality of nanowires comprise unipolar nanowires.

4. The method of claim 3, wherein the plurality of nanowires comprise a Schottky diode formed between each respective nanowire and seed particle.

5. The method of claim 1, wherein the plurality of nanowires comprise axial pn-junctions.

6. The method of claim 5, wherein the plurality of nanowires comprise a p-doped end and an n-doped end, and the p-doped ends point in the same direction.

7. The method of claim 5, wherein the axial pn-junctions are grown in a single gas phase synthesis process.

8. The method of claim 5, wherein:
the axial pn-junctions form a functional part of the nanowire device which comprises a photovoltaic cell;
axes of the majority of the plurality of nanowires are aligned normal to the substrate such that only a bottom end of the majority of the plurality of nanowires having a first polarity contacts the substrate; and
a transparent contact contacts a top end of the majority of the plurality of nanowires having a second polarity.

9. The method of claim 1, wherein the plurality of nanowires comprise radial pn-junctions.

10. The method of claim 9, wherein the radial pn-junctions form a functional part of the nanowire device.

11. The method of claim 1, wherein the nanowires comprise heterostructure nanowires.

12. The method of claim 1, wherein dopants and source materials are introduced during the step of growing the plurality of nanowires.

13. The method of claim 1, wherein the plurality of nanowires enhances or modifies a function of the substrate.

14. The method of claim 1, wherein fixing the plurality of nanowires comprises solidifying or polymerizing a fixative and wherein the plurality of nanowires is deposited during or prior to solidifying or polymerizing the fixative.

15. The method of claim 1, further comprising depositing the plurality of nanowires on the surface by applying the nanowire dispersion on the surface.

16. The method of claim 15, wherein:
the surface comprises the surface of the substrate;
depositing the plurality of nanowires on the surface comprises depositing the plurality of nanowires on the surface of the substrate by applying the nanowire dispersion to the substrate; and
aligning the plurality of nanowires comprises aligning the plurality of nanowires such that at least the majority of the plurality of nanowires are aligned vertically with respect to the surface of the substrate such that the same end of at least the majority of the plurality nanowires contacts the surface of the substrate.

17. The method of claim 16, wherein the plurality of nanowires is deposited on both the surface of the substrate and an opposing surface of the substrate.

18. The method of claim 17, wherein the nanowires on the surface of the substrate are of a different type than the nanowires on the opposing surface of the substrate.

19. The method of claim 16, wherein the plurality of nanowires is deposited on the surface of the substrate in a continuous process.

20. The method of claim 19, wherein the continuous process is a roll-to-roll process.

21. The method of claim 1, further comprising forming an induced dipole in the nanowires prior to or during aligning.

22. The method of claim 16, wherein the surface of the substrate comprises a polymer coating.

23. The method of claim 1, wherein the functional pattern is produced by a structured electrode.

24. The method of claim 1, wherein the functional pattern comprises the pattern of dots.

25. The method of claim 1, wherein the functional pattern comprises the pattern of stripes.

26. The method of claim 1, wherein the functional pattern comprises the checkerboard pattern.

* * * * *